United States Patent [19]
Flaig et al.

[11] Patent Number: 5,674,077
[45] Date of Patent: Oct. 7, 1997

[54] INTERLEAVED CONNECTOR CIRCUIT HAVING INCREASED BACKPLANE IMPEDANCE

[75] Inventors: Charles M. Flaig, Cupertino; William Todd Krein, San Jose, both of Calif.

[73] Assignee: Apple Computer, Inc., Cupertino, Calif.

[21] Appl. No.: 315,885

[22] Filed: Sep. 30, 1994

[51] Int. Cl.[6] ................................................ H05K 1/02
[52] U.S. Cl. .......................... 439/63; 174/250; 439/55; 333/99 R; 333/1
[58] Field of Search ............................ 333/1, 99 R, 236, 333/238, 239, 81 A, 243-33; 439/55, 63, 212, 213; 361/777, 766, 818; 174/216, 255, 250

[56] References Cited

U.S. PATENT DOCUMENTS

| | | | |
|---|---|---|---|
| 4,060,295 | 11/1977 | Tomkiewicz | 339/17 LC |
| 5,025,211 | 6/1991 | Craft et al. | 324/158 R |
| 5,557,562 | 9/1996 | Yoshiharu et al. | 364/708.1 |

OTHER PUBLICATIONS

"The Proposed IEEE 896 Futurebus—A Solution to the Bus Driving Problem", National Semiconductor Corp., Application Note 458, R.V. Balakrishnan, undated, pp. 2-94 to 2-95.

*Primary Examiner*—Laura Thomas
*Attorney, Agent, or Firm*—Fenwick & West LLP

[57] ABSTRACT

Connectors on a microcomputer printed circuit board backplane receive slotted insertion of a plurality of device cards containing application specific integrated circuits (ASICs). Interconnection of the device card connectors is accomplished on the surface of the circuit board or internally with an electric line which interleaves the device card connectors providing increased conductor length between physically adjacent connectors, establishing an increased impedance level. The increased physical lengths of the intervening electric lines between the connectors provide increased impedance as seen by inserted device cards, which enhances the matching capabilities of the connectors.

13 Claims, 5 Drawing Sheets

INTERLEAVED CONNECTOR CIRCUIT HAVING INCREASED BACKPLANE IMPEDANCE

TECHNICAL FIELD

This invention relates to electric backplane circuits used for computer applications and more particularly to electric backplane circuits having increased impedance levels.

BACKGROUND OF THE INVENTION

Increasing miniaturization of electric circuitry in microcomputer systems causes pronounced impedance setting problems at the electrical backplanes into which circuit cards are connected. The backplane is typically a portion of the motherboard of a microcomputer system. Typically, a plurality of circuit cards are plugged into connectors which are mechanically mounted upon the backplane in parallel array. When these circuit cards communicate with each other across the backplane, the total communication delays are a function of the delay times in the respective circuit cards combined with the backplane derived circuit delays. One impedance problem relates to the spacing of electrical connectors mounted on the surface of the backplane within the case of a personal computer. Electrical connectors are, for example, employed to mount and connect selected Application Specific Integrated Circuit chips (ASICs) on device cards into the computer system. When the particular electrical connectors are closely spaced to each other, the impedance of a backplane as detected at the inserted circuit cards is substantially reduced. Current ASIC driver circuits on the circuit cards are of limited effectiveness in driving signals into the diminished impedance of the backplane caused by diminished electric line spacings between successive ones of the bus connectors.

It may accordingly be desirable to provide a circuit solution to the problem of diminished impedance seen by electric circuits coupled to closely spaced connector elements on a circuit board.

SUMMARY OF THE INVENTION

In accordance with the circuitry of the present invention, impedance levels are increased as detected at circuit board connectors by circuit boards or other circuitry which is plugged into a selected slot of the circuit board connector. The increase in impedance levels in accordance with the present invention are obtained by skipping selected adjacent connectors during the fabrication of electric lines upon the circuit board and by establishing a path reversal in the electric lines connecting successive connectors. In particular, the lengths of the electric lines between electrically successive connectors are approximately two or more integer multiples of a standard physical separation length between adjacent connectors. Such line lengths between adjacent electrically coupled connectors are achieved by skipping one or more of the contiguously positioned electrical connectors. This results in an interleaving of electric lines when a single electric line is connected to every other electric connector, for example. Then, at the end of a number of line connections in one direction, the electric line reverses direction to interconnect the electric connectors skipped along the one direction.

The folding back of the electric lines in a reverse direction is done in order to maximize the number of connectors in a given space on a particular circuit board according to industry standard spacing, for example a physical spacing of one inch between physically adjacent connectors. The electric lines skip one or more physically adjacent connectors, but to avoid wasting a connector already installed on the circuit board according to specified physical spacing requirements, the electric lines reverse direction, i.e., fold back, to pick up to skipped connectors.

According to an embodiment of the present invention, at least three bus connectors are mounted on an electric circuit board for electrical connection with external electric circuits. The bus connectors are elongated and are positioned parallel to each other with a plural number of electric lines forming a bus connected there between. The electric bus lines connecting the bus connectors are fabricated on the surface of the circuit board or within the circuit board according to conventional stripline or microstrip technologies. In the case of stripline fabrication, conductive vias are formed in the circuit boards to permit electrical connection between electrical contacts in the bus connectors and the various electric lines of the microstrip. The electric bus lines are connected to the first and third bus connectors in accordance with the present invention, thereby skipping the second bus connector positioned between the first and third bus connectors. In the case of stripline bus lines, the electric connection lines pass directly under the second connector but are electrically insulated therefrom by the dielectric material of the circuit board. In the case of a microstrip embodiment, the bus lines are fabricated on the surface of the circuit board along a selected detour path that avoids the second bus connector. The electric bus lines additionally connect the second and third bus connectors along a path that is substantially electrically equivalent to a direct path between the first and the third bus connectors.

DETAILED DESCRIPTION OF THE PREFERRED EMBODIMENTS

Figure 1A:
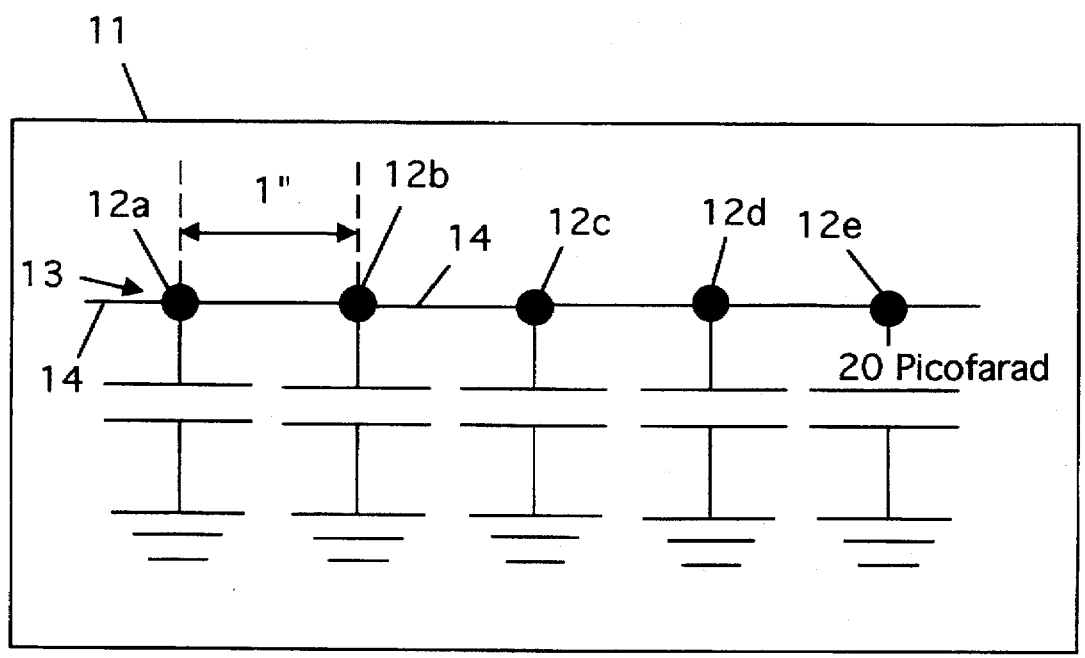
FIG. 1a is a schematic representation of a conventional connector bus on a circuit board.
Figure 1B:
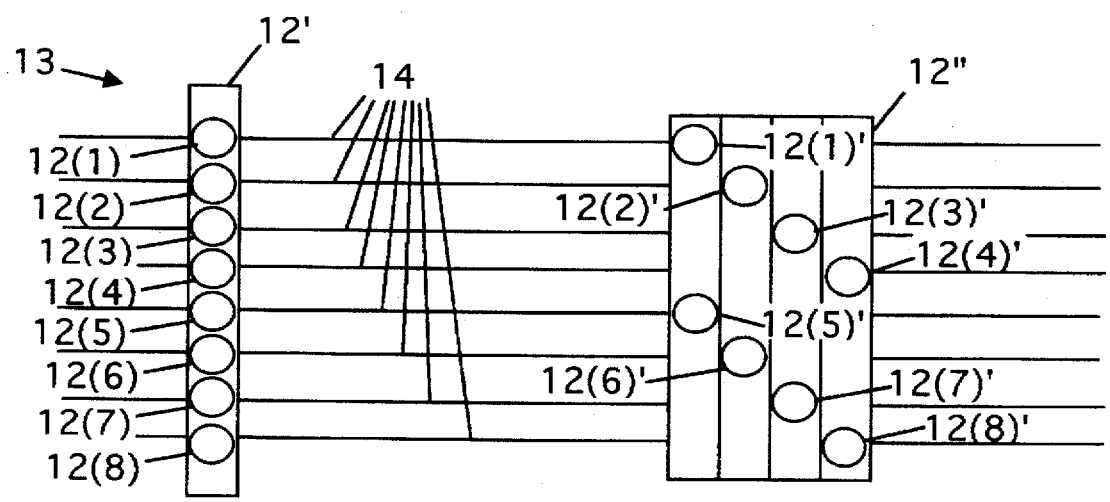
FIG. 1b is a schematic representation of first and second connector types on a conventional connector bus.

FIG. 1a is a schematic representation of a conventional connector bus on a circuit board 11 including a backplane region. Circuit board 11 may be known as the motherboard for a particular microcomputer system. In particular, FIG. 1a shows a plurality of electric connectors, for example 12a–12e which are interconnected in a bus conductor 13 that is disposed along a shortest path of connections to each, successive one of electric connectors 12a–12e. The connectors 12a–12e are preferably conventional circuit card connectors (not shown) having slots for receiving therein the connecting edges of the circuit cards. A connector may have different configurations, as illustrated in FIG. 1b, for connecting a plurality of signal lines in parallel, to circuit cards inserted therein. FIG. 1a shows a capacitor connected to each electric connector 12a–12e, representing not an actual capacitor connected to each node, but the effective capacitance of each electric connector 12a–12e.

Figure 3A:
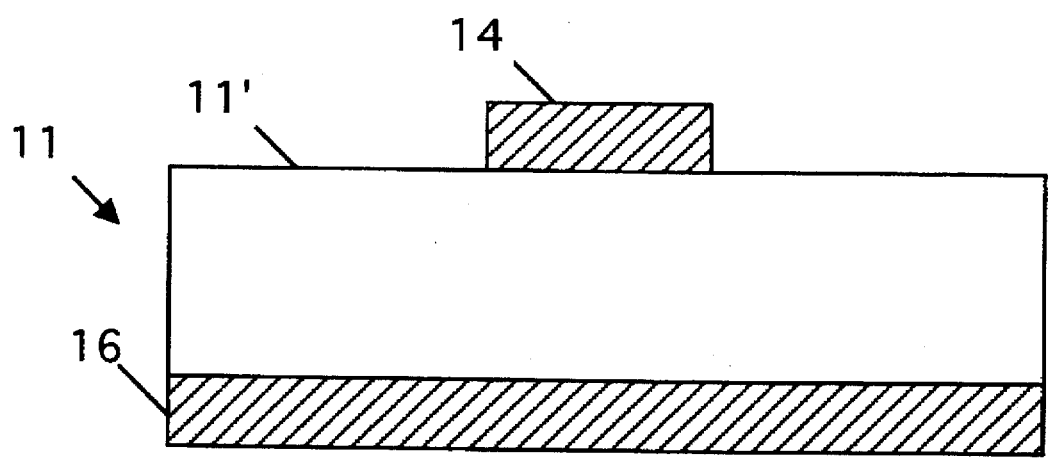
FIG. 3a is a side cross sectional view of a portion of a conventional circuit board showing a conventional electrical microstrip on one side of a dielectric substrate and a groundplane on the other side of the dielectric substrate.

In conventional bus designs, the physical separation of bus connectors 12a–12e along the bus conductors is typically about one inch, but the physical separations between the parallel bus conductors are much less. The effective capacitance of a particular bus connector 12a–12e to a ground plane 16 of the circuit board 11, as shown in FIG. 3a, is about 20 Picofarad according to one embodiment of the invention. The segment of connecting line 14 between adjacent ones of connectors 12a–12e (i.e., before insertion of a card in each of the connector slots), has a characteristic impedance that is approximately 50 Ohms, according to the embodiment shown. Additionally, the combined characteristic impedance of a bus conductor for a single card inserted into a connector will be approximately 17 Ohm.

This impedance is based upon the relationship:

$$Z = Z_0/(1+(C_L/[(C_0)\cdot(L)]))^{1/2}, \quad \text{(Eq. 1)}$$

wherein Z is the impedance of a bus conductor detected at a connector;

$Z_0$ is the unloaded or characteristic impedance of the electric line without a card inserted into the connector, (typically in the range of 50 Ohms to approximately 75 Ohms);

$C_L$ is the capacitive loading of the connector, which is approximately 20 pF;

$C_0$ is the capacitance of the electric line per unit length, which may be approximately 3 pF/inch; and L is the physical separation length (i.e., "electrical distance") between electrically connected connectors.

FIG. 1b is a schematic representation of conventional first and second connectors on a connector bus 13 having eight bus lines 14. Bus 13 includes first and second connectors 12' and 12" respectively. First connector 12' is a single bus connector having eight in-line contacts 12(1)–12(8) respectively which may be respectively soldered to corresponding ones of the eight bus lines 14. In a microstrip embodiment of the present invention, the bus lines 14 are fabricated on the surface of a circuit board. Alternatively, contacts 12(1)–12(8) may be electrically connected to circuit board vias which are connected to striplines fabricated within the circuit board. FIG. 1b shows eight electric lines comprising a single bus, but conventional busses including 16 lines or 32 lines or custom busses having any selected predetermined number of lines may also be used. Second connector 12" is a multiple bar connector having eight contacts 12(1)'–12(8)' staggered across the multiple bars of second connector 12".

Staggering of contacts 12(1)'–12(8)' as shown in FIG. 1b permits relatively larger contact structures and bus connectors relative to the separation dimensions between lines 14. The contacts may be respectively soldered to corresponding ones of the eight bus lines 14, according to a microstrip embodiment of the present invention in which lines 14 are fabricated on the surface of a circuit board. Alternatively, contacts 12(1)'–12(8)' may be electrically connected to circuit board vias which are connected to striplines fabricated within the circuit board.

Figure 2:
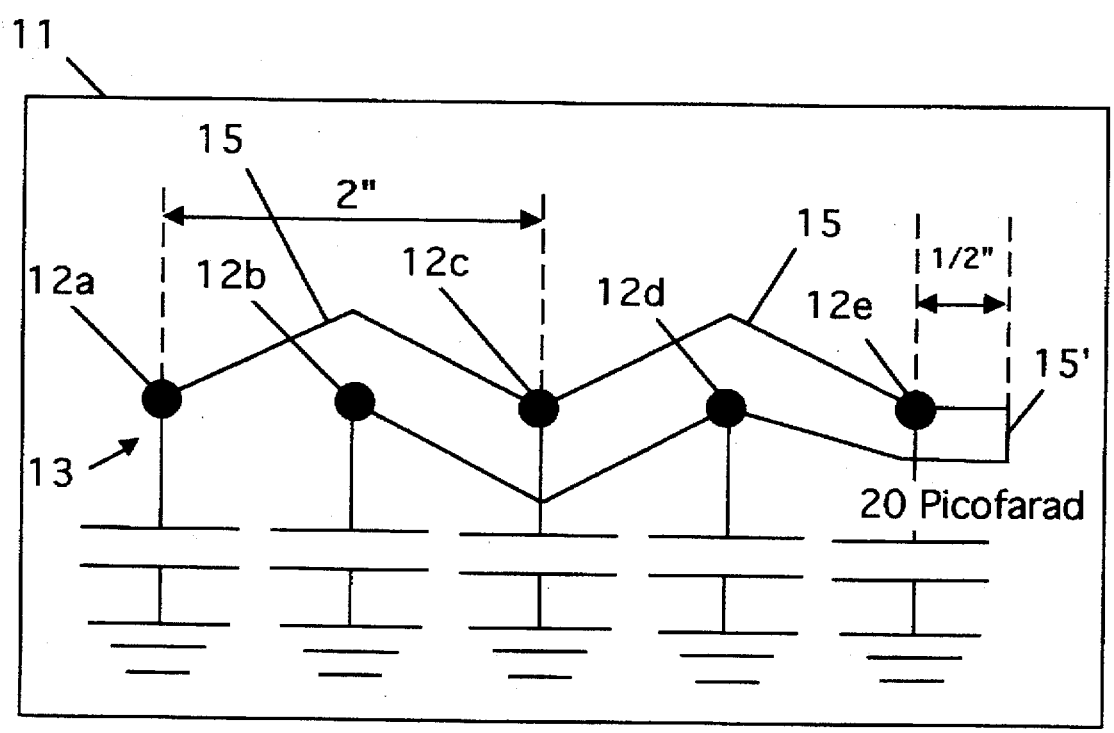
FIG. 2 is a schematic representation of a connector bus according to the present invention in which the connectors of the connector bus are interleaved.

FIG. 2 is a schematic representation of a connector bus 13 including bus connectors 12a–12e, according to the present invention. In this embodiment of the present invention, connectors 12a–12e of connector bus 13 are interleaved. According to another embodiment of the present invention, the connectors 12a–12e are not arranged along a single axis. The connectors 12a–12e maintain a standard physical separation distance from each other, as for example one inch (1") apart. However, they are electrically either staggered regularly or they may be irregularly arranged. Of the present invention, the circuit arrangement increases the impedance level detected at circuit board connectors 12a–12e by a circuit (not shown) which may be plugged into a selected slot of the circuit board connector 12a–12e. The increased impedance levels are obtained by skipping selected adjacent connectors 12a–12e during the fabrication of electric lines 15 upon circuit board 11.

In particular, the lengths of the electrical line segments 15 between electrically successive connectors 12a–12e are approximately two or more integer multiples of a standard physical separation length between adjacent connectors. Such line lengths between adjacent electrically coupled connectors 12a–12e are achieved by forming the line to skip one or more of the contiguously positioned electrical connectors 12a–12e, and then forming a line along a return path to connect to the skipped connectors. The line connection between the two physically adjacent connectors 12d and 12e in FIG. 2 is not directly made, but rather, an additional line portion or loop is formed to create a physical line length that is comparable to the line lengths between connectors connected in conventional succession. As shown in FIG. 2, this extra line length 21 is formed in a direction away from connector 12d and then reversing the direction at a location approximately one half of the physical spacing between adjacent connectors. According to one embodiment of the present invention, the line along one direction connects an odd sequence of connectors, and the electric line along the path in the return direction connects an even sequence of the connectors. According to another embodiment of the present invention, the electric line along the path in one direction connects an even sequence of the connectors, and the electric line along the return path connects an odd sequence of the connectors. According to yet another embodiment of the present invention, the complete electric line connecting the connectors includes multiple line portions. A first line portion connects alternate ones of the connectors along a path oriented in a first direction. Another line portion connects intermediate ones of the connectors which were skipped by the first line portion connecting alternate ones of the connectors. These two line portions are further connected by yet another line portion which is substantially the same in length as the electrical separation distance between successive electrically connected connectors.

According to one embodiment of the present invention, the physical separation between successive connectors 12a–12e is approximately one inch. However, not considering the electrical connections, the actual physical connections between adjacent connectors is one inch. For such a one inch physical separation, the electrical separation is an integer multiple of one inch for integers two or greater, depending on the number of connectors skipped. For example, to skip one connector, the electrical separation is two inches. A single electric line 15 is connected to every other electric connector 12a–12e, and then, at the end of the path of connections in one direction, reverses direction to interconnect the electric connectors 12a–12e skipped along the path of connections in the one direction. Alternatively, electric line 15 is connected to skip more than a single connector at a time. With interleaved connectors, the characteristic impedance detected by a card inserted into a connector is increased.

According to Equation 1, if one connector is skipped:

$$Z=50/\{1+[20/((3)(2))]\}^{1/2}=24 \text{ Ohms}.$$

According to Equation 1, if two connectors are skipped, causing a three inch electrical separation between successive electrically connected connectors:

$$Z=50/\{1+[20/((3)(3))]\}^{1/2}=27 \text{ Ohms}.$$

However, if no connectors are skipped, causing a one inch electrical separation:

$$Z=50/\{1+[20/((3)(1))]\}^{1/2}=18 \text{ Ohms}.$$

Accordingly, by increasing the distance between adjacent connectors and thereby increasing the line capacitance, the characteristic impedance detected by a card inserted into a connector is substantially increased. The increase in impedance between skipping no connectors to skipping one connector is approximately 33 percent. A further increase of 15 percent can be obtained by skipping two connectors. However, the incremental percent increase by skipping additional connectors diminishes with each additional connector skipped. Accordingly, the most significant increased impedance is obtained by the step of skipping a single connector as opposed to skipping no connectors at all.

Figure 3B:
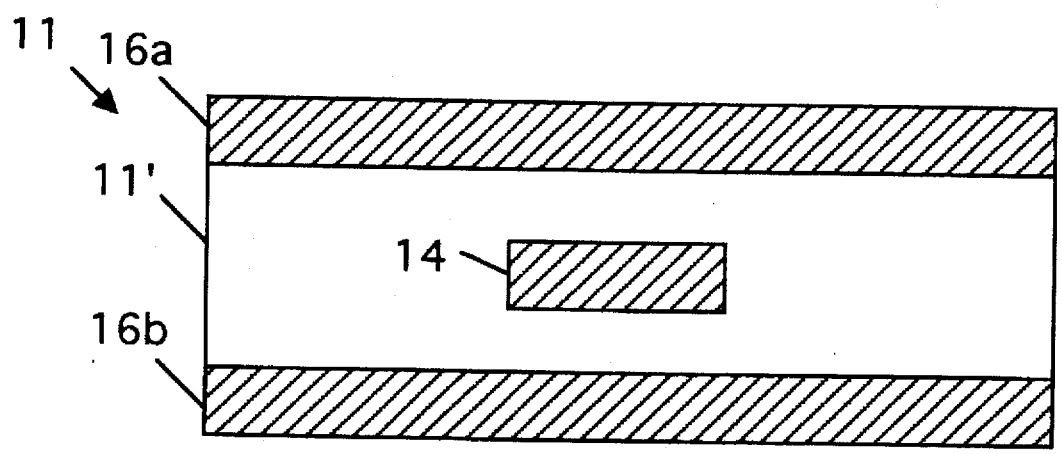
FIG. 3b is a side cross sectional view of a portion of a conventional circuit board showing a conventional electrical stripline within a dielectric substrate with first and second groundplanes disposed on opposite surfaces of the dielectric substrate.

FIG. 3a is a side cross sectional view of a portion of a conventional circuit board 11 showing a conventional electrical microstrip line 14 on one surface of a dielectric substrate, and showing a groundplane 16 on the opposite surface of the dielectric substrate of circuit board 11. The electrical lines 15 between connectors 12a–12e shown in FIG. 2 can be implemented in microstrip on the surface of circuit board 11. FIG. 3b is a side cross sectional view of a portion of a conventional circuit board 11 showing a conventional electrical stripline 14 within a dielectric substrate with respective first and second groundplanes 16a and 16b disposed on the opposite surfaces of the dielectric substrate. According to an embodiment of the present invention relying upon a stripline implementation, electric vias are fabricated in a conventional manner to connect the microstrip to connectors mounted on the surface of the dielectric substrate. The electrical lines 15 between connectors 12a–12e shown in FIG. 2 can be implemented in microstrip on the surface of circuit board 11.

To construct one embodiment of the present invention, circuit board 11 is fabricated from dielectric substrate 11'. Dielectric substrate 11 is provided with a conductive groundplane 16 which is applied as a metallic layer or aluminum or copper for example, according to well known thick film deposition techniques or according to thin film techniques involving vapor deposition of one or more selected conductive metals. The method according to an embodiment of the present invention includes fabricating connector elements 12a–12e and connecting them to the surface of the dielectric substrate for receiving electric cards (not shown) or other electric devices. Electric lines 15 are manufactured on the surface of the printed circuit board 11 along interleaved paths on its surface, connecting section alternating ones of connector elements 12a–12e. In general, interleaving is accomplished by making connections which are to other than the immediately nearest electric nodes.

To construct another embodiment of the present invention, circuit board 11 is again fabricated from a dielectric substrate 11'. Dielectric substrate 11' is provided with first and second electric groundplanes, 16a and 16b, which are applied as a metallic layer or aluminum or copper for example, according to well known thick film deposition techniques or according to thin film techniques involving vapor deposition of one or more selected conductive metals. The method according to an embodiment of the present invention includes fabricating connector elements 12a–12e and connecting them to the surface of the dielectric substrate for receiving electric cards (not shown) or other electric devices. Electric lines 15 are manufactured below the surface of the printed circuit board 11 along interleaved paths, connecting section alternating ones of connector elements 12a–12e. In general, interleaving is accomplished by making connections which are to other than the immediately nearest electric nodes.

Therefore, the circuit arrangement of the present inventor increases the characteristic impedance detected at circuit board connectors by a circuit card plugged into a selected slot of the circuit board connector. Increased impedance levels are obtained according to the present invention by skipping selected adjacent connectors in the connection of electric lines of the circuit board along a path of one direction that reverses, and then interconnects one or more skipped connectors. Thereafter, the path may return in the original direction. The lengths of the electrical lines between electrically successive connectors are approximately two or more integer multiples of a standard physical spacing between adjacent connectors. According to another embodiment of the invention, two connectors are skipped. Such line lengths between adjacent electrically coupled connectors are achieved by skipping one or more of the contiguously positioned connectors and interleaving the electric lines between the bus connectors.

What is claimed is:

1. An electric circuit on a printed circuit board including bus connectors for receiving electric circuit cards, said circuit arrangement comprising:

a printed circuit board substrate including a selected surface and an opposite surface;

a plurality of bus connectors mounted upon the selected surface of said printed circuit board substrate, said plurality of bus connectors including selected first, second, and third bus connectors; and an electric line connecting said selected first, second, and third bus connectors of said plurality of said bus connectors, said selected first, second, and third bus connectors being substantially aligned along a common axis and said second selected bus connector being substantially equidistant from said selected first and third bus connectors, the distance between said selected first and said selected third bus connectors being greater than the distance between said selected first bus connector and said selected second bus connector; and said electric line directly connecting said selected first and said selected third bus connectors, and directly connecting said selected second and third bus connectors.

2. The electric circuit according to claim 1, wherein said plurality of bus connectors are interconnected along an interleaved pattern of said electric line.

3. The electric circuit according to claim 1, wherein said electric line includes at least a single stripline fabricated on said selected surface.

4. The electric circuit according to claim 1, wherein said electric line includes microstrip fabricated below said selected surface and connected to said surface by electric vias.

5. The electric circuit according to claim 1, wherein said electric line connects said connectors in a path comprising an outward bound path and a return path.

6. The electric circuit according to claim 5, wherein said outward bound path connects an odd sequence of said connectors and said return path connects and even sequence of said connectors.

7. The electric circuit according to claim 5, wherein said outward bound path connects an even sequence of said connectors and said return path connects an odd sequence of said connectors.

8. A circuit for interconnecting a plurality of connectors on a selected surface of a printed circuit board for receiving and connecting to electric circuit cards, comprising:

a circuit board including a selected surface;

a plurality of connectors mounted equidistantly in series at a selected common separation distance on the selected surface of the circuit board substrate; and an electric line fabricated in said printed circuit board, including a first line portion connecting alternate ones of the plurality of connectors along a path oriented in a first direction, a second line portion connecting intermediate ones of the connectors on said printed circuit board along a path oriented in a second direction, and a third line portion connecting said first and second line portions along a path substantially equal in length to the electrical separation distance between electrically connected connectors.

9. The circuit according to claim 8, wherein alternate ones of said plurality of connectors are interleaved with intermediate ones of said plurality of connectors along a common axis.

10. The circuit according to claim 8, wherein the connections between said plurality of connectors are made with electric stripline.

11. The circuit according to claim 8, wherein said third line portion is non-monotonic.

12. The circuit according to claim 8, wherein said first line portion includes an odd sequence of said plurality of connectors and wherein said second line portion includes an even sequence of said plurality of connectors on a return path.

13. The circuit according to claim 8, wherein said first line portion includes an even sequence of said plurality of connectors and wherein said second line portion includes an odd sequence of said plurality of connectors.

* * * * *